(12) United States Patent
Katz

(10) Patent No.: US 9,766,991 B1
(45) Date of Patent: Sep. 19, 2017

(54) ENERGY AWARE CLOUD PROVISIONING

(71) Applicant: International Business Machines Corporation, Armonk, NY (US)

(72) Inventor: Jeffrey S. Katz, West Hartford, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/282,088

(22) Filed: Sep. 30, 2016

(51) Int. Cl.
    G06F 11/20      (2006.01)
    H04L 29/08      (2006.01)
    G01R 25/00      (2006.01)
    G08B 21/18      (2006.01)

(52) U.S. Cl.
    CPC ........ G06F 11/2023 (2013.01); H04L 67/101 (2013.01); *G01R 25/00* (2013.01); *G06F 11/203* (2013.01); *G08B 21/18* (2013.01); *H04L 67/1097* (2013.01); *H04L 67/34* (2013.01)

(58) Field of Classification Search
    CPC .................................................. G06F 11/203
    See application file for complete search history.

(56) References Cited

U.S. PATENT DOCUMENTS

| 8,583,945 | B2  | 11/2013 | Tran |   |
|---|---|---|---|---|
| 9,128,899 | B1* | 9/2015 | McAlister | G06F 11/203 |
| 2010/0152910 | A1* | 6/2010 | Taft | G01R 25/00 |
| | | | | 700/286 |
| 2010/0292857 | A1* | 11/2010 | Bose | G05B 15/02 |
| | | | | 700/292 |
| 2010/0318827 | A1 | 12/2010 | Shah et al. | |
| 2011/0282508 | A1* | 11/2011 | Goutard | H04L 63/20 |
| | | | | 700/293 |
| 2012/0033473 | A1* | 2/2012 | Scharf | H02J 3/383 |
| | | | | 363/131 |

(Continued)

OTHER PUBLICATIONS

Mell, P. et al., "The NIST Definition of Cloud Computing," National Institute of Standards and Technology (NIST), US Dept. of Commerce, Special Pub. 800-145, Sep. 2011, retrieved from the Internet:<http://csrc.nist.gov/groups/SNS/cloudcomputing/index.html>, 7 pg.

(Continued)

*Primary Examiner* — Jimmy H Tran
(74) *Attorney, Agent, or Firm* — Cuenot, Forsythe & Kim, LLC

(57) ABSTRACT

A first phasor measurement data can be received. The first phasor measurement data can be generated by a measurement of at least a first phasor parameter of a utility power as received by a first data center. At least a second phasor measurement can be received. The second phasor measurement can be generated by a measurement of at least a second phasor parameter of the utility power as received by at least a second data center. A phase difference between the utility power as received by the first data center and the utility power as received by the second data center can be determined. Whether the phase difference exceeds a threshold value can be determined. Responsive to determining that the phase difference exceeds the threshold value, transfer of at least one workload from the first data center to at least the second data center can be initiated.

14 Claims, 6 Drawing Sheets

(56) References Cited

U.S. PATENT DOCUMENTS

| | | | |
|---|---|---|---|
| 2012/0082159 A1* | 4/2012 | Taft | H04L 12/1836 370/390 |
| 2015/0234441 A1* | 8/2015 | Jackson | G06F 1/3203 713/300 |
| 2015/0339200 A1* | 11/2015 | Madduri | G06F 11/2028 714/4.11 |
| 2016/0011618 A1 | 1/2016 | Janous et al. | |
| 2016/0077871 A1* | 3/2016 | Kaplan | G06F 9/4881 718/102 |
| 2016/0315774 A1* | 10/2016 | Faruque | H04L 9/3242 |
| 2016/0334447 A1* | 11/2016 | Parashar | G01R 25/00 |
| 2017/0006135 A1* | 1/2017 | Siebel | H04L 67/34 |

OTHER PUBLICATIONS

"Phasor Measurement Unit," [online] Wikipedia, the Free Encyclopedia, Aug. 31, 2016, retrieved from the Internet: <"https://en.wikipedia.org/w/index.php?title=Phasor_measurement_unit&oldid=737052124">, 6 pg.

"Smarter Energy Research Institute (SERI) Applications," [online] IBM Research [retrieved Jun. 21, 2016], retrieved from the Internet: <http://www.research.ibm.com/client-programs/seri/applications.shtml>, 3 pg.

"NASPI," [online] North American SynchroPhasor Initiative, Mar. 2015, Pacific Northwest National Laboratory, US Dept. of Energy, retrieved from the Internet: <https://www.naspi.org/home>, 2 pg.

"NYISO," [online] New York Independent System Operator [retrieved Jun. 21, 2016], retrieved from the Internet: <http://www.nyiso.com/public/index.jsp>, 3 pg.

* cited by examiner

600

Receive at least a first phasor measurement data, the first phasor measurement data generated by a measurement of at least a first phasor parameter of a utility power as received by a first data center
602

Receive at least a second phasor measurement data, the second phasor measurement data generated by a measurement of at least a second phasor parameter of the utility power as received by at least a second data center
604

Determine, by comparing the first phasor measurement data to at least the second phasor measurement data using a processor, a phase difference between the utility power as received by the first data center and the utility power as received by the second data center
606

Determine whether the phase difference exceeds a threshold value
608

Responsive to determining that the phase difference exceeds the threshold value, automatically initiate transfer of at least one workload from the first data center to at least the second data center
610

Responsive to transferring the at least one workload from the first data center to at least the second data center, initiate at least one hardware resource used for processing the at least one workload to enter into an idle mode or sleep mode, or initiate the at least one hardware resource used for processing the at least one workload to power off
612

FIG. 6

ENERGY AWARE CLOUD PROVISIONING

BACKGROUND

The present invention relates to cloud computing, and more specifically, to transferring of workloads between data centers.

Cloud computing is a model of service delivery for enabling convenient, on-demand network access to a shared pool of configurable computing resources. Examples of such resources include networks, network bandwidth, servers, processing, memory, storage, applications, virtual machines, and services. With cloud computing, these computing resources can be rapidly provisioned and released with minimal management effort or interaction with a provider of the service.

SUMMARY

A method includes receiving at least a first phasor measurement data, the first phasor measurement data generated by a measurement of at least a first phasor parameter of a utility power as received at a first data center. The method also can include receiving at least a second phasor measurement data, the second phasor measurement data generated by a measurement of at least a second phasor parameter of the utility power as received by at least a second data center. The method also can include determining, by comparing the first phasor measurement data to at least the second phasor measurement data using a processor, a phase difference between the utility power as received by the first data center and the utility power as received by the second data center. The method also can include determining whether the phase difference exceeds a threshold value. The method also can include, responsive to determining that the phase difference exceeds the threshold value, automatically initiating transfer of at least one workload from the first data center to at least the second data center.

A system includes a processor programmed to initiate executable operations. The executable operations include receiving at least a first phasor measurement data, the first phasor measurement data generated by a measurement of at least a first phasor parameter of a utility power as received by a first data center. The executable operations also can include receiving at least a second phasor measurement data, the second phasor measurement data generated by a measurement of at least a second phasor parameter of the utility power as received by at least a second data center. The executable operations also can include determining, by comparing the first phasor measurement data to at least the second phasor measurement data, a phase difference between the utility power as received by the first data center and the utility power as received by the second data center. The executable operations also can include determining whether the phase difference exceeds a threshold value. The executable operations also can include, responsive to determining that the phase difference exceeds the threshold value, automatically initiating transfer of at least one workload from the first data center to at least the second data center.

A computer program includes a computer readable storage medium having program code stored thereon. The program code is executable by a processor to perform a method. The method includes receiving, by the processor, at least a first phasor measurement data, the first phasor measurement data generated by a measurement of at least a first phasor parameter of a utility power as received by a first data center. The method also can include, by the processor, receiving at least a second phasor measurement data, the second phasor measurement data generated by a measurement of at least a second phasor parameter of the utility power as received by at least a second data center. The method also can include determining, by the processor comparing the first phasor measurement data to at least the second phasor measurement data, a phase difference between the utility power as received by the first data center and the utility power as received by the second data center. The method also can include determining, by the processor, whether the phase difference exceeds a threshold value. The method also can include, responsive to determining that the phase difference exceeds the threshold value, automatically initiating, by the processor, transfer of at least one workload from the first data center to at least the second data center.

BRIEF DESCRIPTION OF THE DRAWINGS

FIG. 6 is a flow chart illustrating an example of a method of allocating workloads in a cloud computing environment.

DETAILED DESCRIPTION

Figure 1:
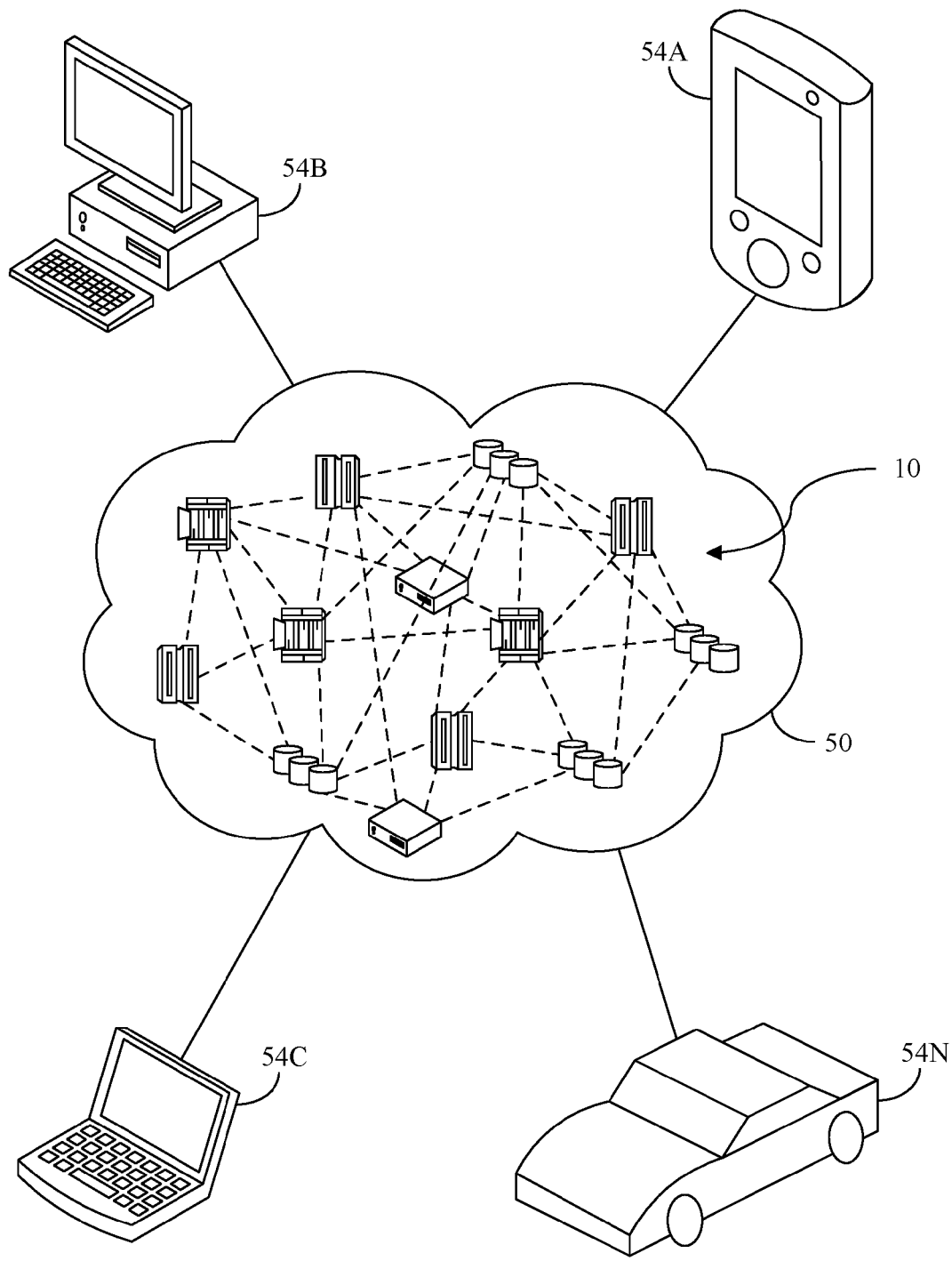
FIG. 1 depicts an example of a cloud computing environment.

This disclosure relates to cloud computing, and more specifically, to transferring of workloads between data centers. In accordance with the arrangements described herein, wide scale problems in an electrical grid can be predicted, even before the impact of such problems begins to occur widely. For example, blackouts and brownouts can be predicted before a wide area of consumers actually experience such conditions. Responsive to predicting such problems in an electrical grid, workloads can be transferred from a data center, which is located in a geographic region that will be impacted, to one more other data centers. Transferring the workloads to the other data centers can mitigate risk that the workloads will be negatively affected by the problems in an electrical grid. Moreover, transferring the workloads can reduce the amount of power used by the data center in the affected geographic region, which can mitigate the impact of the problems on other consumers. In illustration, data centers typically consume large amounts of electrical power. If a brownout is predicted to occur, reducing the data center's power consumption can reduce the overall power demand on the electrical grid, and thus reduce the level of voltage sag, frequency drop, or other degradation that will occur during the brownout.

Several definitions that apply throughout this document now will be presented.

As defined herein, the term "utility power" means electricity delivered by a wide area electrical grid. An electrical grid is an interconnected network for delivering electricity from suppliers to consumers of electricity, and includes generating stations that produce electricity, high-voltage transmission lines that carry electricity from the suppliers to demand centers, and distribution lines that carry the electricity to the consumers.

As defined herein, the term "phasor parameter" means a parameter indicating at least a phasor of a cycle of a sinusoidally varying electricity (e.g., A/C voltage) carried on a conductor of a power system. For example, a phasor parameter can indicate a time origin for a cycle of a sinusoidally varying electricity, a time when a cycle of a sinusoidally varying electricity reaches its maximum value of voltage for that cycle, a time when a cycle of the sinusoidally varying electricity reaches its minimum value of voltage for that cycle, or a time when a cycle of the sinusoidally varying electricity crosses a particular level of voltage in that cycle. As defined herein, the term "phasor parameter" is not an identifier that identifies a particular conductor (e.g., conductor for phase A, conductor for phase B or conductor for phase C) of a single-phase or multi-phase power system, although a phasor parameter may be included in phasor measurement data that identifies a particular conductor of a power system. For example, a phasor parameter can be indicate precise phase (with regard to timing) of a voltage waveform on a conductor carrying a particular phase (e.g., phase A, phase B or phase C) of a multi-phase (typically three) power system.

As defined herein, the term "conductor" means a collaborative of conductive electrical wires and devices (e.g., transformers, breakers, switches, etc.) carrying electricity for a particular phase (e.g., phase A, phase B or phase C) of a single phase or multi-phase power system.

As defined herein, the term "time origin" means a time when a voltage of a sinusoidally varying electricity crosses a zero voltage value.

As defined herein, the term "phase difference" means the difference between the phasor of sinusoidally varying electricity measured at a first location and the phasor of the sinusoidally varying electricity measured at a second location.

As defined herein, the term "lag" means to be later than.

As defined herein, the term "responsive to" means responding or reacting readily to an action or event. Thus, if a second action is performed "responsive to" a first action, there is a causal relationship between an occurrence of the first action and an occurrence of the second action, and the term "responsive to" indicates such causal relationship.

As defined herein, the term "computer readable storage medium" means a storage medium that contains or stores program code for use by or in connection with an instruction execution system, apparatus, or device. As defined herein, a "computer readable storage medium" is not a transitory, propagating signal per se.

As defined herein, the term "processor" means at least one hardware circuit (e.g., an integrated circuit) configured to carry out instructions contained in program code. Examples of a processor include, but are not limited to, a central processing unit (CPU), an array processor, a vector processor, a digital signal processor (DSP), a field-programmable gate array (FPGA), a programmable logic array (PLA), an application specific integrated circuit (ASIC), programmable logic circuitry, and a controller.

As defined herein, the term "real time" means a level of processing responsiveness that a user or system senses as sufficiently immediate for a particular process or determination to be made, or that enables the processor to keep up with some external process.

As defined herein, the term "automatically" means without user intervention.

As defined herein, the term "user" means a person (i.e., a human being).

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as Follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, server class computers, SANs, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as Follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as Follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Referring now to FIG. 1, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 1 are intended to be illustrative only and that computing nodes 10 and cloud computing environment 50 can communicate with any type of computerized device over any type of network and/or network addressable connection (e.g., using a web browser).

Figure 2:
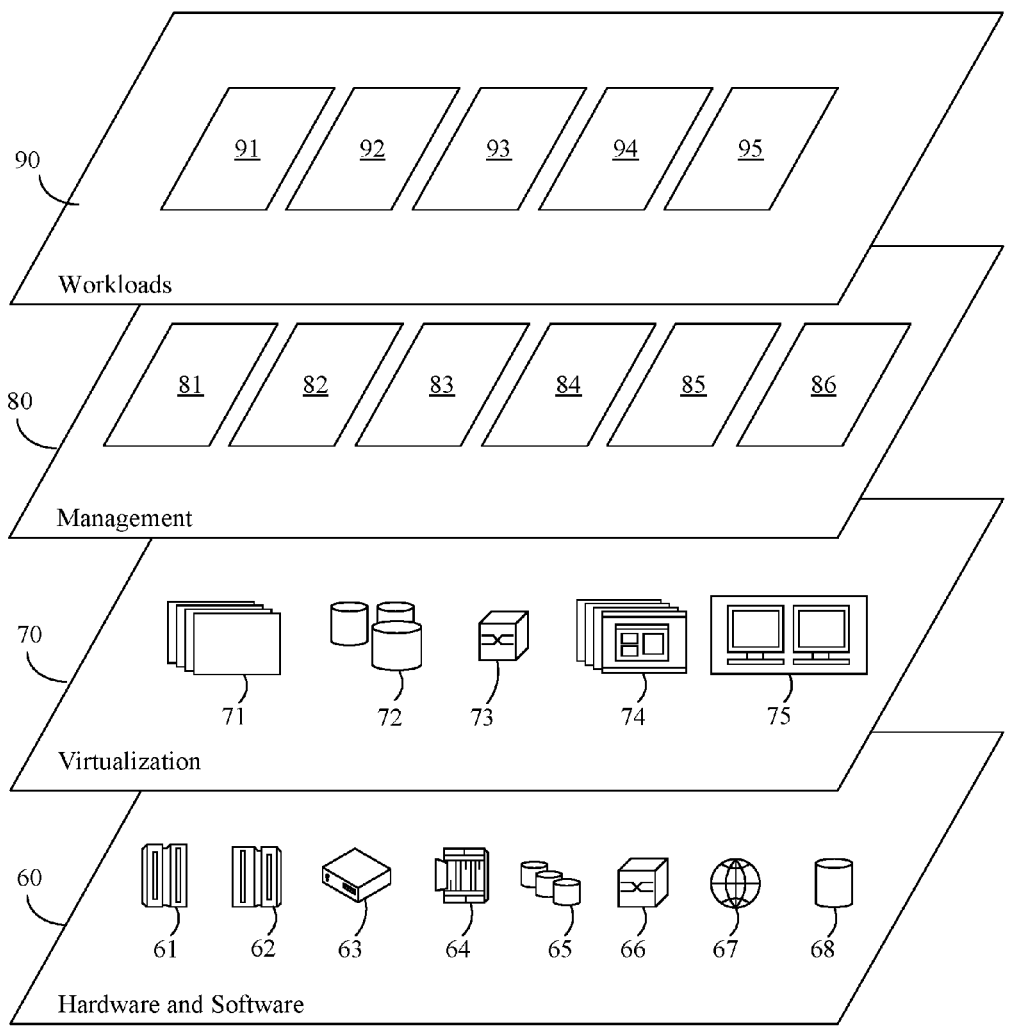
FIG. 2 depicts an example of abstraction model layers provided by a cloud computing environment.

Referring now to FIG. 2, a set of functional abstraction layers provided by cloud computing environment 50 (FIG. 1) is shown. It should be understood in advance that the components, layers, and functions shown in FIG. 2 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA. Load allocation 86 provides dynamic allocation of workloads across hardware and software resources 60 and virtualization layer 70.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; and transaction processing 95.

Figure 3:
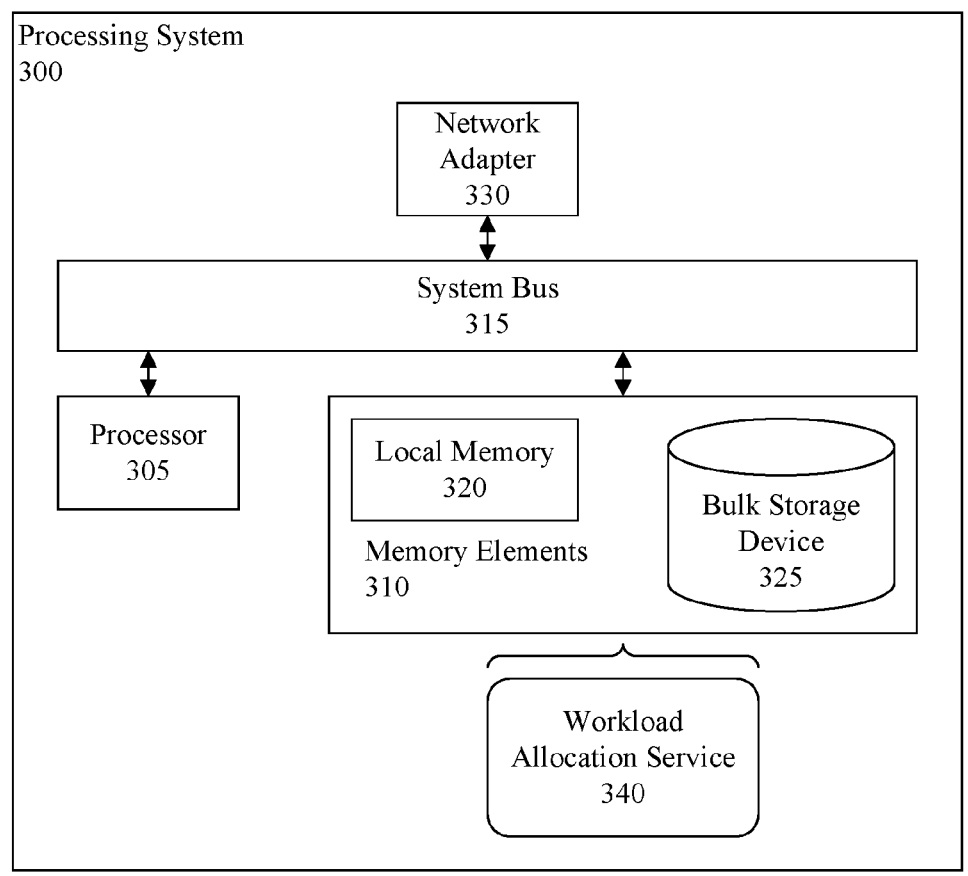
FIG. 3 is a block diagram illustrating example architecture for a processing system of a cloud computing node.

FIG. 3 is a block diagram illustrating example architecture for a processing system 300 of a cloud computing node 10. Processing system 300 can include at least one processor (e.g., a central processing unit) 305 coupled to memory elements 310 through a system bus 315 or other suitable circuitry. As such, processing system 300 can store program code within memory elements 310. Processor 305 executes the program code accessed from memory elements 310 via system bus 315 or the other suitable circuitry.

In one aspect, processing system 300 is implemented as a computer or other programmable data processing apparatus that is suitable for storing and/or executing program code. It should be appreciated, however, that processing system 300 can be implemented in the form of any system including a processor and memory that is capable of performing and/or initiating the functions and/or operations described within this disclosure. Further, processing system 300 can be implemented in any of a variety of different form factors including, but not limited to, a portable device such as a mobile communication device, a tablet computing and/or communication device, a laptop computing device, a desktop computing device, a server, or similar devices/systems.

Memory elements 310 include one or more physical memory devices such as, for example, local memory 320 and one or more bulk storage devices 325. Local memory 320 refers to RAM or other non-persistent memory device(s) generally used during actual execution of the program code. Bulk storage device(s) 325 can be implemented as a hard disk drive (HDD), solid state drive (SSD), or other persistent data storage device. Processing system 300 also can include one or more cache memories (not shown) that provide temporary storage of at least some program code in order to reduce the number of times program code must be retrieved from bulk storage device 325 during execution.

One or more network adapters 330 also can be coupled to processing system 300, for example via system bus 315, to enable processing system 300 to become coupled to other systems, computer systems, remote printers, and/or remote storage devices through intervening private or public networks. Modems, cable modems, wireless transceivers, and Ethernet cards are examples of different types of network adapters 330 that can be used with processing system 300.

As pictured in FIG. 3, memory elements 310 can store a workload allocation service 340, which may be a component of load allocation 86 (FIG. 1). Workload allocation service 340, being implemented in the form of executable program code, is executed by processing system 300 and, as such, is considered an integrated part of processing system 300. Moreover, workload allocation service 340, including any parameters and/or attributes utilized by workload allocation service 340, are functional data structures that impart functionality when employed as part of processing system 300. As will be further described, workload allocation service 340 can be configured to allocate workloads from one or more nodes 10 of cloud computing environment 50 to one or more other nodes 10 responsive to detecting various conditions present in an electrical power grid.

Figure 4:
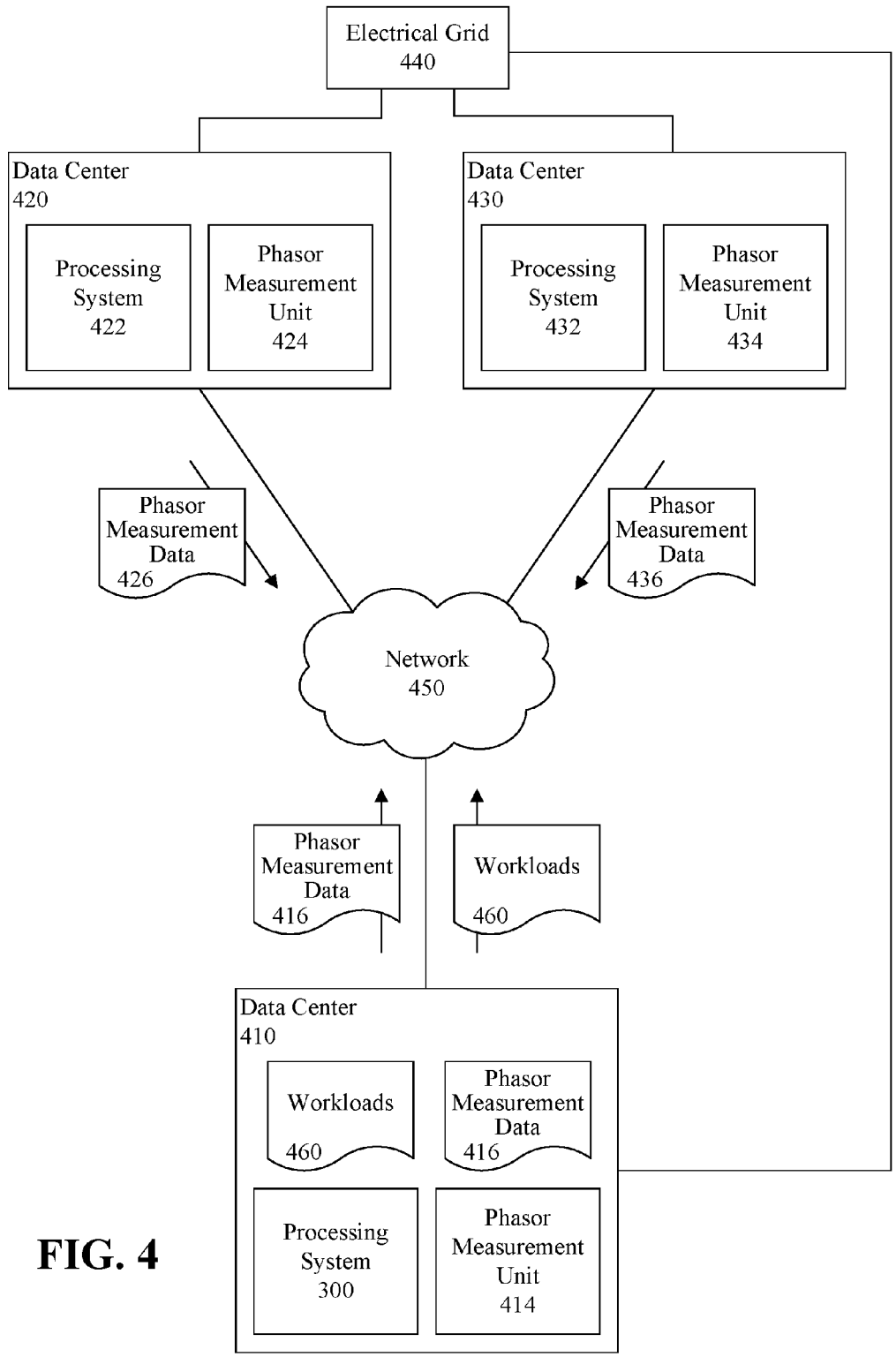
FIG. 4 depicts an example of data centers operating in a cloud computing environment.

FIG. 4 depicts an example of a plurality of data centers 410, 420, 430 operating in a cloud computing environment 50. Each data center 410-430 can be connected to an electrical grid 440 to receive utility power (i.e., electricity) from electrical grid 440. Data center 410 can include processing system 300 and a phasor measurement unit 414. Similarly, data center 420 can include a processing system 422 and a phasor measurement unit 424, and data center 430 can include a processing system 432 and a phasor measurement unit 434. In one non-limiting arrangement, phasor measurement units 414, 424, 434 can be components of the respective processing systems 300, 422, 432. In another non-limiting arrangement, processing systems 300, 422, 432 can be components of the respective phasor measurement units 414, 424, 434. Additional data centers (not shown) also can operate in the cloud computing environment 50 and can include respective processing systems and phasor measurement units.

Data centers 410-430 can be communicatively linked via network 450. Network 450 can be a high speed (e.g., high bandwidth and low latency) network, for example using fiber optic lines. Thus, large volumes of data can be communicated between data centers 410-430 very rapidly. Indeed, via network 450, data centers 410-430 can rapidly transfer workloads to one another.

A phasor measurement unit is a device which measures the electrical waves on an electrical grid using a common time source for synchronization. Time synchronization allows synchronized real-time measurements of multiple remote measurement points on an electrical grid to generate phasor measurement data, which includes phasor parameters indicating a phasor difference (e.g., phase angle) of electrical sine waves. An example of a phasor parameter is a synchrophasor. A synchrophasor includes time-synchronized numbers that represent both the magnitude and phase of the sinusoidal waves found in electricity, and are time-synchronized for accuracy.

In operation, phasor measurement unit 414 can measure phasor parameters of electricity provided to data center 410 by electrical grid 440 to generate phasor measurement data 416. Similarly, phasor measurement unit 424 can measure phasor parameters of electricity provided to data center 420 by electrical grid 440 to generate phasor measurement data 426, and phasor measurement unit 434 can measure phasor parameters of electricity provided to data center 430 by electrical grid 440 to generate phasor measurement data 436. Phasor measurement data 416-426 can represent respective phasing of the sinusoidal voltage waveforms and, optionally, also indicate the respective magnitudes of the voltage. For example, the phasor parameters can be synchrophasors, which can be represented in phasor measurement data 416-436.

Figure 5:
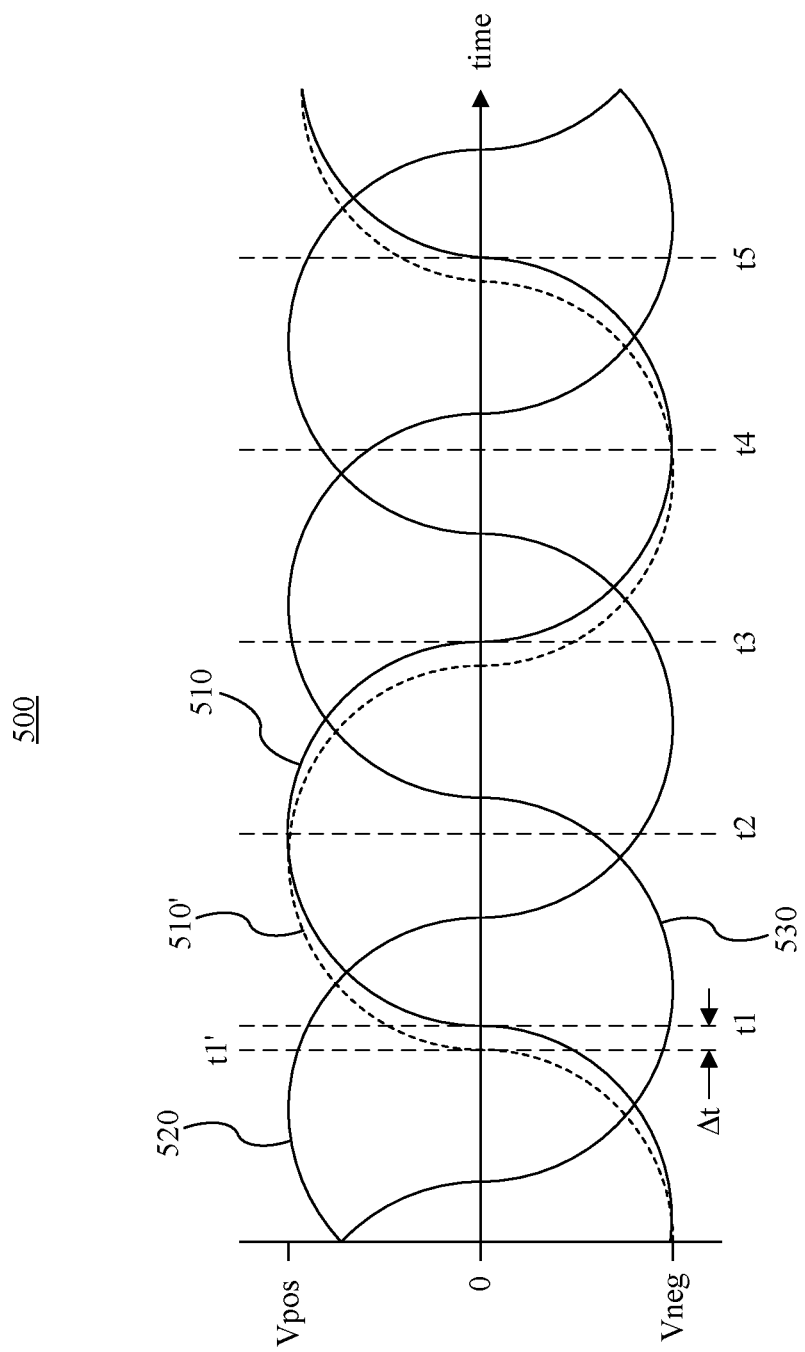
FIG. 5 is a graph depicting sinusoidal waveforms of a time varying voltages on respective conductors of a multi-phase power system.

In illustration, each phasor measurement unit 414-434 can, for each conductor of the utility power (e.g., conductor for phase A, conductor for phase B, conductor for phase C), measure the phasor parameters. For example, referring to the graph 500 of FIG. 5, for each conductor of the utility power received by data center 410, phasor measurement unit 414 can measure the time (t) when the respective sinusoidal waveforms 510, 520, 530 of the electricity (e.g., A/C voltage) crosses or meets a particular level of voltage. The particular level of voltage can be zero (0), a maximum positive voltage (Vpos), a maximum negative voltage (Vneg), or a specified level of voltage. For instance, phasor measurement unit 414 can measure time t1 when the voltage waveform 510 crosses zero (0) volts from a negative voltage to a positive voltage (e.g., the time origin of the waveform 510), time t2 when the voltage waveform 510 meets the maximum positive voltage (Vpos), time t3 when the voltage waveform 510 crosses zero (0) volts from a positive voltage to a negative voltage, time t4 when the voltage waveform 510 meets the maximum negative voltage (Vneg), or a time when the voltage waveform 510 crosses another defined voltage level. Phasor measurement unit 424 can perform similar phasor measurements for voltage waveforms on utility power received by data center 420, and phasor measurement unit 434 can perform similar phasor measurements for voltage waveforms on utility power received by data center 430.

The time measurements can be very precise. For example, phasor measurement units 414-434 can receive time signals from a global positioning system (GPS). Using GPS time signals, phasor measurement units 414-434 can measure the time (t) when the sinusoidal waveforms 510 cross or meet a particular level of voltage to a precision better than +/−one microsecond.

Processing system 300 can receive phasor measurement data 416 from phasor measurement unit 414 in real time responsive to phasor measurement unit 414 measuring phasor parameters. Processing system 422 can receive phasor measurement data 426 from phasor measurement unit 424 in real time responsive to phasor measurement unit 424 measuring phasor parameters, and communicate phasor measurement data 426 to processing system 300 in real time. Similarly, processing system 432 can receive phasor measurement data 436 from phasor measurement unit 434 in real time responsive to phasor measurement unit 434 measuring phasor parameters, and communicate phasor measurement data 436 to processing system 300 in real time. In another arrangement, phasor measurement units 424, 434 can be configured to communicate phasor measurement data 426, 436, respectively, directly to processing system 300 in real time. Further, processing system 300 or phasor measurement unit 414 can communicate phasor measurement data 416 to processing system 422 and processing system 432 in real time.

Processing system 300 can compare, in real time, phasor measurement data 426, 436 to phasor measurement data 416 and, based on such comparisons, determine, in real time, a phase difference between phasor measurement data 416 and phasor measurement data 426, and determine, in real time, a phase difference between phasor measurement data 416 and phasor measurement data 436. Optionally, processing system 300 also can determine, in real time, a phase difference between phasor measurement data 426 and phasor measurement data 436.

To determine the phase difference between respective phasor measurement data 416-436, processing system 300 can compare the time measurements indicated in phasor measurement data 416-436. In illustration, because each data center 410-430 is connected to electrical grid 440, the phasing of voltage on each utility power conductor (e.g., conductors for phase A, phase B or phase C), as received by the respective data centers 410-430, can be relatively close, for example within 30°, though not exact. Processing system 300 can, for each utility power conductor, identify time measurements corresponding to the particular utility power conductor that are made for the same wave cycle of the utility power. For example, processing system 300 can identify time measurements that are within a particular period of time of one another, thus indicating that they are for the same wave cycle. For instance, processing system 300 can identify time measurements that are within 1.4 nanoseconds of each other, which corresponds to 30° of a 60 Hz waveform.

Having identified the time measurements corresponding to the particular utility power conductors that are made for the same wave cycle of the utility power, processing system 300 can, in real time, determine the time differences between the respective time measurements, which represents the phase differences. By way of example, referring to FIG. 5, assume that the phasor measurement data 416 indicates a time t1 for a time origin of the waveform 510, and the phasor measurement data 426 indicates a time t1' for a time origin of the waveform 510'. Also assume that the waveforms 510, 510' are on the same conductor (e.g., phase B) of the utility power, and thus time t1 and time t1' are within a particular period of time of one another. Nonetheless, time t1 lags time t1'. Processing system 300 can determine a time difference, Δt, between time t1' and time t1. If the time difference, Δt, between phasor measurement data 416 and phasor measurement data 426, for that phase of utility power, is forty-six microseconds, this can represent a phase difference of 1° between that phase of utility power as received by data center 410 and that phase of utility power as received by data center 420.

Normally, some phase difference may be expected, for example based on respective geographic locations of data centers 410, 420, 430 and varying supply and load conditions. If the phase difference exceeds a threshold level, though, this can indicate a problem in electrical grid 440. By way of example, if a normal phase difference is equal to or less than 5°, but the phase difference is abnormal, exceeding 5° (i.e., the time measurements differ by a period of more than 231 microseconds), this can indicate a problem in a portion of electrical grid 440 providing power to data center 410. Other measurements by phasor measurement units 414-434 also can indicate a problem in electrical grid 440. In illustration, if a comparison of the respective measurements indicates a signal variance, such as a change in phase angle, frequency, voltage and/or harmonic content, such signal variance can indicate a problem in electrical grid 440. Further, one or more such signal variances in combination with the phase difference exceeding the threshold level can indicate a problem in electrical grid 440. For instance, if the measurements indicate a voltage difference between the utility power received by data centers 410, 420 that lasts more than a threshold period of time (e.g., ten seconds), in addition to a phase difference, this can indicate a problem in a portion of electrical grid 440 providing power to data center 410.

The problem could be due to overloading, a problem with a power generation station, sudden reduction in power generated by power generating equipment (e.g., wind speed decreases significantly in a wind turbine array, cloud cover over a solar cell array, etc.) a problem with power distribution (e.g., downed lines or faulty transformers), and so on. Oftentimes, when a problem occurs, the effects of the problem may not immediately manifest. In some cases, it may take several minutes to hours before troubles in electrical grid 440, such as blackouts or brownouts, begin to occur.

Nonetheless, by analyzing phasor measurement data 416-436, processing system 300 can determine that power supply troubles will occur, or have a high likelihood of occurring. In illustration, processing system 300 can determine whether the phase difference between the utility power received at data center 410 and the utility power received at data center 420 and/or data center 430 exceeds a threshold value. For example, referring to FIG. 5, processing system 300 can determine whether t1 measured at data center 410 differs from t1 measured at data center 420 and/or data center 430 by more than 231 microseconds. Such determination can be made for each of the utility power conductor (e.g., conductors for phase A, phase B and phase C).

If phasor measurement data 416 indicates that the phasor of one or more phases of utility power, as received by data center 410, is different than the phasor of the same one or more phases of the utility power received by data center 420 and data center 430 by more than 5°, this can indicate that there will be problems with the supply of electricity from electrical grid 440 to data center 410 in the near future (e.g., within minutes or hours). Moreover, if the phasor of the utility power received by data center 410 lags the phasor of the utility power received by data center 420 or data center 430 by more than 5° (e.g., t1 measured at data center 410 is more than 231 microseconds later than t1 measured at data center 420 and/or data center 430), this can indicate that there will be problems with the supply of electricity to data center 410 in the near future.

Responsive to determining that the phase difference exceeds the threshold value, processing system 300 can, in real time, automatically initiate transfer of one or more workloads 460 from data center 410 to data center 420, data center 430 and/or another data center via network 450. As noted, network 450 can be a high speed (e.g., high bandwidth and low latency) network. Thus, workloads 460 can be transferred very rapidly, before effects of problems with electrical grid 440 begin to manifest.

To select data centers 420-430 to which to transfer workloads 460, processing system 300 can query, in real time, processing systems 422, 432, as well as processing systems of other data centers, to request information regarding the availability of data centers 420, 430 to process workloads 460. The query also can request information regarding types of workloads each data center 420, 430 is configured to process. Processing systems 422, 432 can respond to the queries in real time. Based on information received from processing systems 422, 432 in response to the query, processing system 300 can, in real time, determine which workloads 460 are to be transferred to data center 420, which workloads 460 are to be transferred to data center 430, and which workloads are to be transferred to one or more other data centers.

The selection of data centers 420-430 also can be based on available network 450 bandwidth between data center 410 and data centers 420, 430. For example, processing system 300 can allocate a greater number of workloads 460 to transfer to a data center 420 to which the network 450 connection has a highest level of bandwidth, and allocate a lesser number of workloads to transfer to a data center 430 to which the network 450 connection has a lower level of bandwidth.

The selection of data centers 420-430 also can be based on the geographic locations of data centers 410-430. For example, if data center 420 is located, geographically, within a threshold distance from data center 410, data center 420 also may be affected by the anticipated troubles in the portion of electrical grid 440 providing power to data center 410. Thus, processing system 300 can determine to not transfer workloads 460 to data center 420, but instead transfer workloads 460 to data center 430, and perhaps one or more other data centers not located within the threshold distance from data center 410.

In one arrangement, workloads 460 that are transferred can be a portion of a total number of workloads processed by data center 410. In this regard, processing system 300 can select which workloads 460 are to be transferred to other data centers 420, 430. For example, processing system 300 can select to transfer workloads 460 that are deemed to be critical workloads 460. Workloads 460 can be deemed to be critical based on service level agreements in place for workloads 460, parameters assigned to workloads 460, or based on any other information available to processing system 300. In another arrangement, workloads 460 that are transferred can be all workloads 460 processed by data center 410. In a further arrangements, workloads 460 can be prioritized, for example based on service level agreements, and transfer of workloads 460 can begin with those having highest priority, then those having a next level of priority, and so on.

In addition, processing system 300 can initiate hardware resources (e.g., servers, storage systems, etc.) used for processing workloads 460 in data center 410 to enter idle mode or sleep mode, or power off, after workloads 460 processed using those hardware resources are transferred. In one arrangement, processing system 300 can transfer workloads 460 and initiate hardware resources used to process those workloads to enter idle mode or sleep mode, or power off, until power usage by data center 410 drops below a threshold value. In this regard, processing system 300 can initiate a portion of hardware resources in data center 410 to enter idle mode or sleep mode, or power off. The usage of utility power by data center 410 can be monitored by phasor measurement unit 414 or another device or system, such as a power meter communicatively linked to processing system 300 or phasor measurement unit 414. If extreme power problems are anticipated based on the determined phase difference (e.g., the phase difference exceeds a second threshold value), processing system 300 can initiate all hardware resources used to process workloads 460 in data center 410 to enter idle mode or sleep mode, or power off, for example after all workloads 460, or all critical workloads 460, have been transferred to other data centers 420, 430.

By transferring workloads 460 from data center 410 to data center 420, data center 430 and/or another data center, processing of workloads 460 can continue unaffected by electrical supply problems that may affect data center 410. Moreover, by removing workloads 460 from one or more hardware components and, optionally, such hardware components entering idle mode, entering sleep mode or powering down, the usage of electricity by data center 410 can reduce the power load on electrical grid 440. This can help to mitigate the impact of utility power problems on other consumers connected to the same part of electrical grid 440 to which data center 410 is connected.

Moreover, by staging phasor measurement units 414-434 and data centers 410-430, data centers 410-430 can receive early warning of impending load problem in electrical grid 440, transfer workloads 460 in real time, and reduce electrical load in real time. This can serve to mitigate interruption of workloads, thereby mitigating risk of service interruption. Further, data centers 410-430 can implement self diagnosed reasons for demand response actions that aid electrical grid 440 (e.g., a local portion of electrical grid 440 experiencing power problems) during a power problem event.

In a further arrangement, data centers 410-430 can communicate phasor measurement data 416-436 and/or the determined phase differences with one or more organizations not related to data centers 410-430, for example the Federal Energy Regulatory Commission (FERC), or the Independent System Operator (ISO) having jurisdiction over the electrical power transmission system in the affected region. Such organizations can process phasor measurement data 416-436 and/or the determined phase differences to anticipate power supply problems in electrical grid 440 and immediately begin implementing corrective actions. This can serve to minimize the amount of time the problems persist. Moreover, using remote cloud computing centers which have their own high speed networks provides benefits of preserving computing resources and providing a high level situational awareness pertaining to the stability of electrical grid 440.

FIG. 6 is a flow chart illustrating an example of a method 600 of allocating workloads in a cloud computing environment. The method 600 can be performed by processing system 300 executing workload allocation service 340.

At step 602, processing system 300 can receive at least a first phasor measurement data, the first phasor measurement data generated by a measurement of at least a first phasor parameter of a utility power as received by a first data center. At step 604, processing system 300 can receive at least a second phasor measurement data, the second phasor measurement data generated by a measurement of at least a second phasor parameter of the utility power as received by at least a second data center.

At step 606, processing system 300 can determine, by comparing the first phasor measurement data to at least the second phasor measurement data using a processor, a phase difference between the utility power as received by the first data center and the utility power as received by the second data center. At step 608, processing system 300 can determine whether the phase difference exceeds a threshold value.

At step 610, responsive to determining that the phase difference exceeds the threshold value, processing system 300 can automatically initiate transfer of at least one workload from the first data center to at least the second data center. Optionally, at step 612, responsive to transferring the at least one workload from the first data center to at least the second data center, processing system 300 can initiate at least one hardware resource used for processing the at least one workload to enter into an idle mode or sleep mode, or initiate the at least one hardware resource used for processing the at least one workload to power off.

While the disclosure concludes with claims defining novel features, it is believed that the various features described herein will be better understood from a consideration of the description in conjunction with the drawings. The process(es), machine(s), manufacture(s) and any variations thereof described within this disclosure are provided for purposes of illustration. Any specific structural and functional details described are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "includes," "including," "comprises," and/or "comprising," when used in this disclosure, specify the presence of stated features, integers, steps, operations, elements, and/or components, but do not preclude the presence or addition of one or more other features, integers, steps, operations, elements, components, and/or groups thereof.

Reference throughout this disclosure to "one embodiment," "an embodiment," or similar language means that a particular feature, structure, or characteristic described in connection with the embodiment is included in at least one embodiment described within this disclosure. Thus, appearances of the phrases "in one embodiment," "in an embodiment," and similar language throughout this disclosure may, but do not necessarily, all refer to the same embodiment.

The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system. The term "and/or" as used herein refers to and encompasses any and all possible combinations of one or more of the associated listed items. It will also be understood that, although the terms first, second, etc. may be used herein to describe various elements, these elements should not be limited by these terms, as these terms are only used to distinguish one element from another unless stated otherwise or the context indicates otherwise.

The term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
receiving at least a first phasor measurement data, the first phasor measurement data generated by a measurement of at least a first phasor parameter of a utility power as received by a first data center;
receiving at least a second phasor measurement data, the second phasor measurement data generated by a measurement of at least a second phasor parameter of the utility power as received by at least a second data center;
determining, by comparing the first phasor measurement data to at least the second phasor measurement data using a processor, a phase difference between the utility power as received by the first data center and the utility power as received by the second data center;
determining whether the phase difference exceeds a threshold value;
responsive to determining that the phase difference exceeds the threshold value, automatically initiating transfer of at least one workload from the first data center to at least the second data center, wherein initiating transfer of at least one workload from the first data center to at least the second data center comprises transferring critical workloads from the first data center to at least the second data center, wherein the critical workloads are workloads defined to be critical by at least one service level agreement; and
responsive to transferring the critical workloads from the first data center to at least the second data center, initiating hardware resources in the first data center used for processing workloads to enter into an idle mode or sleep mode, or initiating the hardware resources to power off.

2. The method of claim 1, further comprising:
determining whether a first time, indicated by the first phasor measurement data, for a cycle of a sinusoidally varying electricity of the utility power as received by the first data center, lags a second time, indicated by the second phasor measurement data, for the cycle of sinusoidally varying electricity of the utility power as received by at least the second data center;
wherein transfer of the at least one workload from the first data center to at least the second data center further is responsive to determining that the first time indicated by the first phasor measurement data lags the second time indicated by the second phasor measurement data.

3. The method of claim 2, wherein:
the first time is a first time origin; and
the second time is a second time origin.

4. The method of claim 1, further comprising:
monitoring usage of the utility power by the first data center;
wherein the hardware resources in the first data center used for processing the workloads are initiated to enter into the idle mode or sleep mode, or are powered off, until power usage by the first data center drops below a threshold value.

5. The method of claim 1, further comprising:
communicating the first phasor measurement data or data indicating the phasor difference to at least one organization not related to the first data center and the second data center.

6. A system, comprising:
a memory and a processor programmed to initiate executable operations comprising:
receiving at least a first phasor measurement data, the first phasor measurement data generated by a measurement of at least a first phasor parameter of a utility power as received by a first data center;
receiving at least a second phasor measurement data, the second phasor measurement data generated by a measurement of at least a second phasor parameter of the utility power as received by at least a second data center;
determining, by comparing the first phasor measurement data to at least the second phasor measurement data, a phase difference between the utility power as received by the first data center and the utility power as received by the second data center;
determining whether the phase difference exceeds a threshold value;
responsive to determining that the phase difference exceeds the threshold value, automatically initiating transfer of at least one workload from the first data center to at least the second data center, wherein initiating transfer of at least one workload from the first data center to at least the second data center comprises transferring critical workloads from the first data center to at least the second data center, wherein the critical workloads are workloads defined to be critical by at least one service level agreement; and
responsive to transferring the critical workloads from the first data center to at least the second data center, initiating hardware resources in the first data center used for processing workloads to enter into an idle mode or sleep mode, or initiating the hardware resources to power off.

7. The system of claim 6, the executable operations further comprising:
determining whether a first time, indicated by the first phasor measurement data, for a cycle of a sinusoidally varying electricity of the utility power as received by the first data center, lags a second time, indicated by the second phasor measurement data, for the cycle of sinusoidally varying electricity of the utility power as received by at least the second data center;
wherein transfer of the at least one workload from the first data center to at least the second data center further is responsive to determining that the first time indicated by the first phasor measurement data lags the second time indicated by the second phasor measurement data.

8. The system of claim 7, wherein:
the first time is a first time origin; and
the second time is a second time origin.

9. The system of claim 6, the executable operations further comprising:
monitoring usage of the utility power by the first data center;
wherein the hardware resources in the first data center used for processing the workloads are initiated to enter into the idle mode or sleep mode, or are powered off, until power usage by the first data center drops below a threshold value.

10. The system of claim 6, the executable operations further comprising:
communicating the first phasor measurement data or data indicating the phasor difference to at least one organization not related to the first data center and the second data center.

11. A computer program product comprising a computer readable storage medium having program code stored thereon, the program code executable by a processor to perform a method comprising:
receiving, by the processor, at least a first phasor measurement data, the first phasor measurement data generated by a measurement of at least a first phasor parameter of a utility power as received by a first data center;
receiving, by the processor, at least a second phasor measurement data, the second phasor measurement data generated by a measurement of at least a second phasor parameter of the utility power as received by at least a second data center;
determining, by the processor comparing the first phasor measurement data to at least the second phasor measurement data, a phase difference between the utility power as received by the first data center and the utility power as received by the second data center;
determining, by the processor, whether the phase difference exceeds a threshold value;
responsive to determining that the phase difference exceeds the threshold value, automatically initiating, by the processor, transfer of at least one workload from the first data center to at least the second data center, wherein initiating transfer of at least one workload from the first data center to at least the second data center comprises transferring critical workloads from the first data center to at least the second data center, wherein the critical workloads are workloads defined to be critical by at least one service level agreement; and
responsive to transferring the critical workloads from the first data center to at least the second data center, initiating hardware resources in the first data center used for processing workloads to enter into an idle mode or sleep mode, or initiating the hardware resources to power off.

12. The computer program product of claim 11, the method further comprising:
determining whether a first time, indicated by the first phasor measurement data, for a cycle of a sinusoidally varying electricity of the utility power as received by the first data center, lags a second time, indicated by the second phasor measurement data, for the cycle of sinusoidally varying electricity of the utility power as received by at least the second data center;
wherein transfer of the at least one workload from the first data center to at least the second data center further is responsive to determining that the first time indicated by the first phasor measurement data lags the second time indicated by the second phasor measurement data.

13. The computer program product of claim 12, wherein:
the first time is a first time origin; and
the second time is a second time origin.

14. The computer program product of claim 11, the method further comprising:
monitoring usage of the utility power by the first data center;
wherein the hardware resources in the first data center used for processing the workloads are initiated to enter into the idle mode or sleep mode, or are powered off, until power usage by the first data center drops below a threshold value.

* * * * *